United States Patent
Wada et al.

(10) Patent No.: US 9,065,023 B2
(45) Date of Patent: Jun. 23, 2015

(54) LIGHT EMITTING DEVICE AND MANUFACTURING METHOD FOR THE SAME

(71) Applicant: Toyoda Gosei Co., Ltd., Kiyosu-shi (JP)

(72) Inventors: Satoshi Wada, Kiyosu (JP); Kosei Fukui, Kiyosu (JP); Toshimasa Hayashi, Kiyosu (JP); Takashi Nonogawa, Kiyosu (JP)

(73) Assignee: Toyoda Gosei, Co., Ltd., Kiyosu-shi, Aichi-ken (JP)

(*) Notice: Subject to any disclaimer, the term of this patent is extended or adjusted under 35 U.S.C. 154(b) by 11 days.

(21) Appl. No.: 14/108,081

(22) Filed: Dec. 16, 2013

(65) Prior Publication Data
US 2014/0167087 A1    Jun. 19, 2014

(30) Foreign Application Priority Data

Dec. 18, 2012 (JP) ................................ 2012-275546
Oct. 31, 2013 (JP) ................................ 2013-226478

(51) Int. Cl.
*H01L 33/64* (2010.01)
*H01L 33/50* (2010.01)
*H01L 23/00* (2006.01)

(52) U.S. Cl.
CPC ............ *H01L 33/505* (2013.01); *H01L 33/644* (2013.01); *H01L 2933/0075* (2013.01); *H01L 24/73* (2013.01); *H01L 2224/48472* (2013.01); *H01L 2224/13* (2013.01); *H01L 2224/48091* (2013.01); *H01L 2224/73265* (2013.01); *H01L 2924/12041* (2013.01)

(58) Field of Classification Search
CPC ........ H01L 33/64; H01L 33/50; H01L 33/005
USPC ................................................ 257/98; 438/27
See application file for complete search history.

(56) References Cited

U.S. PATENT DOCUMENTS

| 7,489,076 | B2 * | 2/2009 | Mitsuyama et al. | .......... 313/512 |
| 2004/0257797 | A1 * | 12/2004 | Suehiro et al. | .................. 362/34 |
| 2010/0320479 | A1 | 12/2010 | Minato et al. | |

FOREIGN PATENT DOCUMENTS

| JP | 2007-019096 A | 1/2007 |
| WO | WO 2009/069671 A1 | 6/2009 |

* cited by examiner

*Primary Examiner* — Marc Armand
(74) *Attorney, Agent, or Firm* — McGinn IP Law Group, PLLC

(57) ABSTRACT

The present invention provides a light emitting device, which includes a light emitting diode (LED) chip, a wavelength conversion plate including a fluorescent substance and disposed on a light output surface side of the LED chip, and a sub heat radiation path formed to radiate heat of the wavelength conversion plate. The sub heat radiation path includes a transparent heat-conductive film provided on a surface of the wavelength conversion plate, a heat radiator provided in the vicinity of the LED chip, and a thermal connection member that thermally connects the transparent heat-conductive film to the heat radiator.

9 Claims, 7 Drawing Sheets

LIGHT EMITTING DEVICE AND MANUFACTURING METHOD FOR THE SAME

TECHNICAL FIELD

The present invention relates to a light emitting device (an LED package) including an LED chip and a wavelength conversion plate including a fluorescent substance.

BACKGROUND ART

There has been proposed a light emitting device 51 that both prevents color irregularity and achieves a narrow directivity angle. As illustrated in FIG. 7, the light emitting device 51 includes an LED chip 53 mounted on a mount case 52 through flip-chip mounting, and a wavelength conversion plate 54 including a fluorescent substance 55 and disposed on a light output surface side of the LED chip 53 (Patent Literatures 1, 2). The fluorescent substance 55 of the wavelength conversion plate 54 is excited by light emitted from the LED chip 53 to emit fluorescent light (that is, wavelength-converted light) at a different wavelength from that of the emitted light so that light of a color synthesized from the emitted light and the fluorescent light, or light mainly of the fluorescent color, is output to the outside. A light-reflective covering material 56 covers the perimeter of the LED chip 53.

In such a light emitting device 51, the LED chip 53 itself generates heat during the light emission, and the fluorescent substance 55 generates heat because of an energy loss caused during the wavelength conversion, which makes the wavelength conversion plate 54 hot. Heat of the LED chip 53 itself is efficiently radiated to the mount case 52 through bumps 57. Meanwhile, heat of the wavelength conversion plate 54 is radiated through members around the wavelength conversion plate 54 such as the LED chip 53 and the light-reflective covering material 56. The heat is mainly radiated through a heat radiation path including the LED chip 53, the bumps 57, and the mount case 52 arranged in this order.

CITATION LIST

Patent Literature

Patent Literature 1: Japanese Patent Application Publication No. 2007-19096
Patent Literature 2: International Publication No. WO2009/069671A1

SUMMARY OF INVENTION

Technical Problem

However, the LED chip 53 itself generates heat as described above, and there is a small difference in temperature between the wavelength conversion plate 54 and the LED chip 53. Therefore, radiation of heat of the wavelength conversion plate 54 through the LED chip 53 is not efficient, and the wavelength conversion plate 54 may not be cooled efficiently. The heat reduces the light emitting efficiency of the fluorescent substance 55, which results in a low brightness. In addition, members around the LED chip 53 such as the wavelength conversion plate 54 and the light-reflective covering material 56 are easily subjected to thermal degradation to shorten the life of the light emitting device 51. Such issues become more notable as the junction temperature of the LED chip 53 is higher.

It is therefore an object of the present invention to efficiently radiate heat of a wavelength conversion plate including a fluorescent substance through not only a heat radiation path by way of an LED chip but also a sub heat radiation path that is separate from the former heat radiation path, to emit light at a high brightness by preventing a reduction in light emitting efficiency of the fluorescent substance due to heat, and to extend the life of a light emitting device by preventing thermal degradation of the wavelength conversion plate and members around the wavelength conversion plate.

Solution to Problem

The present invention provides a light emitting device including: a light emitting diode (LED) chip; a wavelength conversion plate including a fluorescent substance and disposed on a light output surface side of the LED chip; and a sub heat radiation path formed to radiate heat of the wavelength conversion plate. The sub heat radiation path includes: a transparent heat-conductive film formed on a surface of the wavelength conversion plate; a heat radiator provided in the vicinity of the LED chip, and a thermal connection member that thermally connects the transparent heat-conductive film to the heat radiator.

The present invention also provides a light emitting device including: a light emitting diode (LED) chip mounted on a mount through flip-chip mounting; a wavelength conversion plate including a fluorescent substance and disposed on a light output surface side of the LED chip; and a sub heat radiation path formed to radiate heat of the wavelength conversion plate. The sub heat radiation path includes: a transparent heat-conductive film formed on a surface of the wavelength conversion plate; and a thermal connection member that thermally connects the transparent heat-conductive film to the mount.

In the light emitting devices, the transparent heat-conductive film may be formed on a light output surface of the wavelength conversion plate, and a wire may be used as the thermal connection member.

The wavelength conversion plate may be formed to be large enough to extend off a peripheral edge of the LED chip, the transparent heat-conductive film may be formed on at least an extending portion of a light input surface of the wavelength conversion plate that extends off the peripheral edge of the LED chip, and a heat-conductive block that mechanically supports the extending portion may be used as the thermal connection member.

The wavelength conversion plate may be formed to be large enough to extend off a peripheral edge of the LED chip, the transparent heat-conductive film may be formed on at least an extending portion of a light input surface of the wavelength conversion plate that extends off the peripheral edge of the LED chip, and a support block that mechanically supports the extending portion may be provided, and a wire that is connected to the transparent heat-conductive film for the extending portion may be used as the thermal connection member.

The wavelength conversion plate may be formed to be large enough to extend off a peripheral edge of the LED chip, the transparent heat-conductive film may be formed on at least an extending portion of a light output surface of the wavelength conversion plate that extends off the peripheral edge of the LED chip, and a heat-conductive frame that surrounds a side perimeter of the wavelength conversion plate may be used as the thermal connection member.

It is preferable that a perimeter of the LED chip be covered by a light-reflective covering material, and the thermal connection member be embedded in the light-reflective covering material. This allows the light-reflective covering material to reflect light that leaks around from the LED chip such that the light can be output upward, and the embedded thermal connection member to function as an internal structure (a reinforcement) for the light-reflective covering material.

It is preferable that the wavelength conversion plate have tapered side end surfaces that become narrower as the side end surfaces extend upward, and the light-reflective covering material also cover the side end surfaces of the wavelength conversion plate. The wavelength conversion plate may be prevented from slipping out of the light-reflective covering material.

The present invention further provides a manufacturing method for a light emitting device, including: mounting a light emitting diode (LED) chip on a mount through flip-chip mounting; disposing a wavelength conversion plate on a light output surface side of the LED chip, the wavelength conversion plate including a fluorescent substance, a transparent heat-conductive film being formed on a surface of the wavelength conversion plate; and thermally connecting the transparent heat-conductive film to the mount by a thermal connection member.

Advantageous Effects of Invention

With the light emitting device according to the present invention and the manufacturing method for the light emitting device, heat of the wavelength conversion plate including the fluorescent substance can be efficiently radiated through not only a heat radiation path by way of the LED chip but also the sub heat radiation path which is separate from the former heat radiation path. Thus, it is possible to emit light at a high brightness by preventing a reduction in light emitting efficiency of the fluorescent substance due to heat. It is also possible to extend the life of the light emitting device by preventing thermal degradation of the wavelength conversion plate and members around the wavelength conversion plate.

BRIEF DESCRIPTION OF DRAWINGS

FIGS. 1A and 1B illustrate a light emitting device according to a first embodiment, in which FIG. 1A is a plan view and FIG. 1B is a sectional view taken along the line Ib-Ib of FIG. 1A;

FIGS. 2A and 2B illustrate a light emitting device according to a second embodiment, in which FIG. 2A is a plan view and FIG. 2B is a sectional view taken along the line IIb-IIb of FIG. 2A;

FIGS. 3A and 3B illustrate a light emitting device according to a third embodiment, in which FIG. 3A is a sectional view during manufacture and FIG. 3B is a sectional view after the manufacture;

FIGS. 5A to 5E illustrate modifications of a wavelength conversion plate or a transparent heat-conductive film, in which FIG. 5A is a sectional view of a first modification, FIG. 5B is a sectional view of a second modification, FIG. 5C is a sectional view of a third modification, FIG. 5D is a sectional view of a fourth modification, and FIG. 5E is a sectional view of a fifth modification;

FIGS. 6A and 6B illustrate a light emitting device according to a fifth embodiment, in which FIG. 6A is a plan view and FIG. 6B is a sectional view taken along the line VIb-VIb of FIG. 6A.

DESCRIPTION OF EMBODIMENTS

Figure 1A:
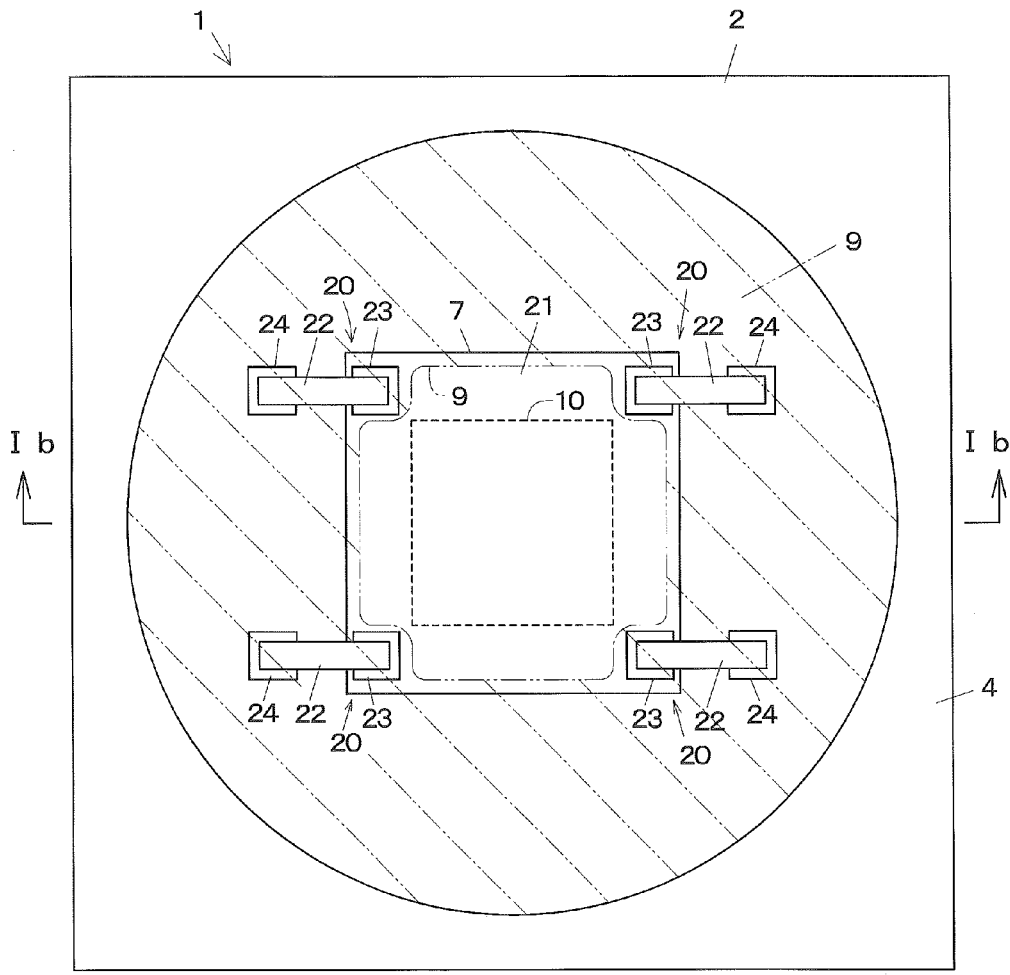

The following describes components of a light emitting device including: a light emitting diode (LED) chip; a wavelength conversion plate including a fluorescent substance and disposed on a light output surface side of the LED chip; and a sub heat radiation path formed to radiate heat of the wavelength conversion plate. The sub heat radiation path includes: a transparent heat-conductive film formed on a surface of the wavelength conversion plate; a heat radiator provided in the vicinity of the LED chip; and a thermal connection member that thermally connects the transparent heat-conductive film to the heat radiator.

1. LED Chip

The color of light emitted from the LED chip and the semiconductor chemical system or layer configuration are not specifically limited. For example, the emitted light may be visible light such as red, orange, green, blue, or violet, or may be ultraviolet light. Examples of the semiconductor chemical system include a GaAs system, a GaP system, a GaN system, a SiC system, and a ZnSe system. The type of mounting of the LED chip is also not specifically limited, and may be flip-chip mounting or face-up mounting. For ease of placement of a wavelength conversion plate on a light output surface of the LED chip, flip-chip mounting is preferable.

2. Wavelength Conversion Plate

The wavelength conversion plate is not specifically limited as long as it includes a fluorescent substance, is translucent, and is formed in a plate shape. Examples of the wavelength conversion plate include:

(a) a plate made of a transparent inorganic material or a transparent organic material in which particles of the fluorescent substance are dispersed inside the plate;

(b) a plate made of a transparent inorganic material or a transparent organic material in which a layer of the fluorescent substance is provided on a surface of the plate;

(c) a plate made of a monocrystalline body, a polycrystalline body, or an amorphous body of the fluorescent substance; and (d) a plate formed by compacting particles of the fluorescent substance through sintering, aggregation, or the like using or not using a binding material.

For (a) and (b), an inorganic material is preferable to an organic material from the viewpoint of the heat resistance and the durability. Examples of the inorganic material include glass. Examples of the organic material include resins. Similarly, for the binding material of (d), an inorganic material is preferable to an organic material. For example, the wavelength conversion plate may be a YAG/alumina sintered body obtained by sintering a YAG fluorescent substance to be discussed later using an alumina binding material.

The fluorescent substance is a substance that is excited by light emitted from the LED chip to radiate fluorescent light (wavelength-converted light) at a different wavelength from that of the emitted light. The fluorescent color and the material of the fluorescent substance may be selected as appropriate in accordance with the usage or the color of the light emitted from the LED chip, and are not specifically limited. Examples of a fluorescent substance excited by blue emitted light to radiate yellow fluorescent light include cerium-activated YAG (yttrium aluminum garnet) and LAG (lutetium aluminum garnet).

The wavelength conversion plate may be flat on both surfaces, or may be entirely or partially curved, or may be entirely or partially uneven. The size of the wavelength conversion plate is not specifically limited. The wavelength conversion plate is preferably large enough to cover the entire light output surface of the LED chip, more preferably larger than the light output surface of the LED chip. The thickness of the wavelength conversion plate is not specifically limited. The thickness of the wavelength conversion plate is preferably 50 to 500 μm from the viewpoint of the light emitting efficiency and the chromaticity adjustment.

The wavelength conversion plate is preferably joined to the light output surface of the LED chip using an adhesive or through thermo-compression bonding, or tightly adhered to the light output surface of the LED chip via a liquid or a viscous such as oil. This is because such a configuration allows the light emitted from the LED chip to be efficiently incident on the wavelength conversion plate. The adhesive may be organic or inorganic. The adhesive preferably has a high refractive index to provide a small difference in refractive index from that of the LED chip. In this respect, an inorganic adhesive is preferable.

3. Sub Heat Radiation Path 3-1. Transparent Heat-Conductive Film

The transparent heat-conductive film is not specifically limited. The transparent heat-conductive film preferably has high heat conductivity compared to the wavelength conversion plate. In particular, a transparent conductive film is preferably used. This is because the transparent conductive film also has high heat conductivity. The material of the transparent heat-conductive film is not specifically limited. Examples of the material of the transparent heat-conductive film include oxides and nitrides of metals such as In, Zn, and Sn, and metals such as Ni (in the form of a thin film of 3 nm or less). Examples of the oxides include ITO (indium tin oxide), $In_2O_3$, ZnO, and $SnO_2$, among which ITO is preferable. These examples all form a transparent conductive film. The thickness of the transparent heat-conductive film is not specifically limited. The thickness of the transparent heat-conductive film is preferably 200 to 900 nm from the viewpoint of the light absorption and the thermal resistance.

The transparent heat-conductive film may be formed on the entirety or a part of the surface of the wavelength conversion plate on the light output side, or may be formed on the entirety or a part of the surface of the wavelength conversion plate on the light input side (on the LED chip side). Examples of the partially formed film include a film formed in the shape of a frame in the vicinity of the peripheral edge of the surface, and a film formed in the shape of parallel, bent, or branched belts on the surface. The entirely formed film has a large effect of collecting heat of the wavelength conversion plate, although the transparent heat-conductive film absorbs a small amount of light. The partially formed film has a small effect of collecting heat of the wavelength conversion plate, although the transparent heat-conductive film absorbs less light.

3-2. Heat Radiator

The heat radiator provided in the vicinity of the LED chip is not specifically limited as long as it has a heat capacity matching the LED chip. Examples of the heat radiator include a mount on which the LED chip is mounted, a heat sink thermally connected to the mount, and a heat sink thermally disconnected from the mount. The form of the mount is not specifically limited. The mount may have a plate shape (such as a substrate), a frame shape (such as a lead frame), or a block shape. Examples of the substrate include a base substrate, a sub-mount substrate, and a substrate portion of a mount case. The form of the heat sink is not specifically limited. The heat sink may have a plate shape, a fin shape, or the like.

The material of the heat radiator is not specifically limited. Examples of the material of the heat radiator include ceramics such as AlN, $Al_2O_3$, and BN, metals such as Al and Cu, and resins containing a heat-conductive filler.

3-3. Thermal Connection Member

The form of the thermal connection member is not specifically limited. Examples of the thermal connection member include a wire, a block, and solder. Examples of the material of the thermal connection member include metals such as Al, Cu, and Au, and ceramics such as AlN, $Al_2O_3$, and BN. A pad made of a metal such as Au, Ag, or Al may be provided at respective portions of the transparent heat-conductive film and the heat radiator to be thermally connected to the thermal connection member.

4. Others (Light-Reflective Filling Material)

A space around the LED chip or a space below the wavelength conversion plate is preferably filled with a light-reflective filling material. In order to facilitate the filling, a case is preferably provided around the LED chip, spaced from the LED chip, to allow the light-reflective filling material to fill the case. Examples of the light-reflective filling material include a white resin. The light-reflective filling material is a filling material containing a light-reflective filler. Examples of the filling material include resins such as silicone and epoxy, and inorganic materials such as glass. Examples of the light-reflective filler include particles of ceramics such as $Al_2O_3$ and $TiO_2$.

First Embodiment

Figure 1B:
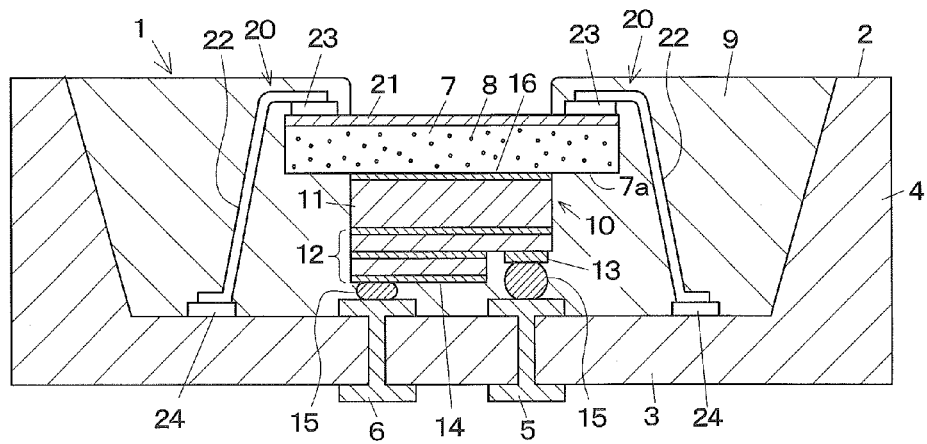

A light emitting device 1 according to a first embodiment illustrated in FIGS. 1A and 1B is an example of a top-view type surface mount device (SMD), and includes a mount case 2, an LED chip 10, a wavelength conversion plate 7, a sub heat radiation path 20 that radiates heat of the wavelength conversion plate 7, and a light-reflective covering material 9. For the components, those described above may be used besides those described below.

The mount case 2 includes a substrate portion 3 and a frame portion 4 that extends upright from the outer edge portion of the substrate portion 3. The substrate portion 3 and the frame portion 4 are formed integrally with each other from a ceramic (for example, AlN). The substrate portion 3 is provided with a negative pattern 5 and a positive pattern 6 that are conductive. The negative pattern 5 and the positive pattern 6 each include an upper pattern and a lower pattern that are conductively connected through a via. The substrate portion 3 and the frame portion 4 may be formed separately from each other. The mount case 2 may be a mount substrate with no frame portion.

In the LED chip 10, semiconductor layers 12 (for example, of a GaN system) such as an n-type semiconductor layer, a light emitting layer, and a p-type semiconductor layer are stacked on a transparent substrate 11 (for example, a sapphire substrate), and an n electrode 13 and a p electrode 14 are formed on the n-type semiconductor layer and the p-type semiconductor layer, respectively, to emit light (for example, blue light) corresponding to inter-transition energy. The LED chip 10 is mounted on the substrate portion 3 through flip-chip mounting with each of the n electrode 13 and the p electrode 14 connected to the corresponding upper pattern through a bump 15. The upper surface of the transparent substrate 11 serves as a light output surface.

The wavelength conversion plate 7 is a plate made of glass inside which particles of a fluorescent substance 8 (for example, YAG) are dispersed. The wavelength conversion plate 7 is formed to be large enough to extend off the peripheral edge of the LED chip 10. The wavelength conversion plate 7 is joined to the light output surface of the transparent substrate 11 of the LED chip 10 using an inorganic adhesive 16. For example, the YAG fluorescent substance 8 is excited by blue light emitted from the LED chip 10 to radiate yellow fluorescent light. The upper surface of the wavelength conversion plate 7 is its light output surface. White light synthesized from the blue emitted light and the yellow fluorescent light which are complimentary colors is output to the outside.

The sub heat radiation path 20 includes a transparent heat-conductive film 21 formed on the entire light output surface of the wavelength conversion plate 7, the substrate portion 3 of the mount case 2 which serves as the heat radiator, and ribbon wires 22 (for example, Al; for example, four wires) that serve as the thermal connection member and that thermally connect the transparent heat-conductive film 21 and the substrate portion 3 to each other. More particularly, bonding pads 23 (for example, Au) are provided at the four corners of the upper surface of the transparent heat-conductive film 21. Bonding pads 24 (for example, Au) are provided at four locations on the upper surface of the substrate portion 3 spaced from the LED chip 10. The ribbon wires 22 are provided to extend between the bonding pads 23 and 24 with both end portions of the ribbon wires 22 bonded to the bonding pads 23 and 24.

A resin (for example, silicone) containing a highly reflective filler (for example, Al$_2$O$_3$) is used as the light-reflective covering material 9. The entire internal space of the frame portion 4 is filled with the light-reflective covering material 9. The light-reflective covering material 9 not only covers the perimeter of the LED chip 10 but also covers a portion below an extending portion 7a of the wavelength conversion plate 7a that extends off the peripheral edge of the LED chip 10, the perimeter of the wavelength conversion plate 7, and the four corners of the upper surface of the wavelength conversion plate 7 (along with the bonding pads 23 and the end portions of the ribbon wires 22). In addition, the ribbon wires 22 are embedded in the light-reflective covering material 9.

In order to manufacture the light emitting device 1 described above, the following procedures may be taken. The LED chip 10 is mounted on the substrate portion 3 through flip-chip mounting. The wavelength conversion plate 7 is disposed on the light output surface side of the LED chip 10 to be joined thereto. The transparent heat-conductive film 21 and the substrate portion 3 are thermally connected to each other by the ribbon wires 22. The light-reflective covering material 9 is provided through screen printing or by a dispenser to cover the perimeter of the LED chip 10 etc. The ribbon wires 22 are embedded in the light-reflective covering material 9.

With the light emitting device 1 according to the first embodiment, the following functions and effects can be obtained.

(1) Heat of the LED chip 10 itself during light emission is transmitted sequentially through the bumps 15, the patterns 5 and 6, and the substrate portion 3 to be radiated.

(2) Heat generated by an energy loss caused when the fluorescent substance 8 of the wavelength conversion plate 7 is converted in terms of the wavelength is firstly transmitted to the lower surface of the wavelength conversion plate 7 to be radiated through a main heat radiation path including the inorganic adhesive 16, the LED chip 10, the bumps 15, the patterns 5 and 6, and the substrate portion 3 arranged in this order. Secondly, the heat is transmitted to the upper surface of the wavelength conversion plate 7 to be radiated through the sub heat radiation path 20 including the transparent heat-conductive film 21, the bonding pads 23, the ribbon wires 22, the bonding pads 24, and the substrate portion 3 arranged in this order. As discussed earlier, the LED chip 10 itself generates heat, and there is a small difference in temperature between the wavelength conversion plate 7 and the LED chip 10, which makes heat radiation through the main heat radiation path inefficient. Because the sub heat radiation path 20 is irrelevant to such an issue, the sub heat radiation path 20 can efficiently radiate heat to cool the wavelength conversion plate 7 irrespective of the junction temperature of the LED chip 10. In this way, heat of the wavelength conversion plate 7 can be efficiently radiated through not only the main heat radiation path but also the sub heat radiation path 20 which is separate from the main heat radiation path. Thus, it is possible to emit light at a high brightness by preventing a reduction in light emitting efficiency of the fluorescent substance 8 due to heat. It is also possible to extend the life of the light emitting device 1 by preventing thermal degradation of the wavelength conversion plate 7 and the light-reflective covering material 9 as its surrounding member.

(3) The ribbon wires 22 are embedded in the light-reflective covering material 9. Therefore, the ribbon wires 22 function as internal structures (reinforcements) for the light-reflective covering material 9 to improve the stability of the light-reflective covering material 9.

(4) The ribbon wires 22 function to block light emitted from the LED chip 10 and radiated laterally to partially penetrate the light-reflective covering material 9.

(5) The wavelength conversion plate 7 is formed to be large enough to extend off the peripheral edge of the LED chip 10, and the bonding pads 23 are positioned above the extending portion 7a. Thus, light emitted upward from the LED chip 10 is not blocked by the bonding pads 23 or the ribbon wires 22.

Second Embodiment

Figure 2A:
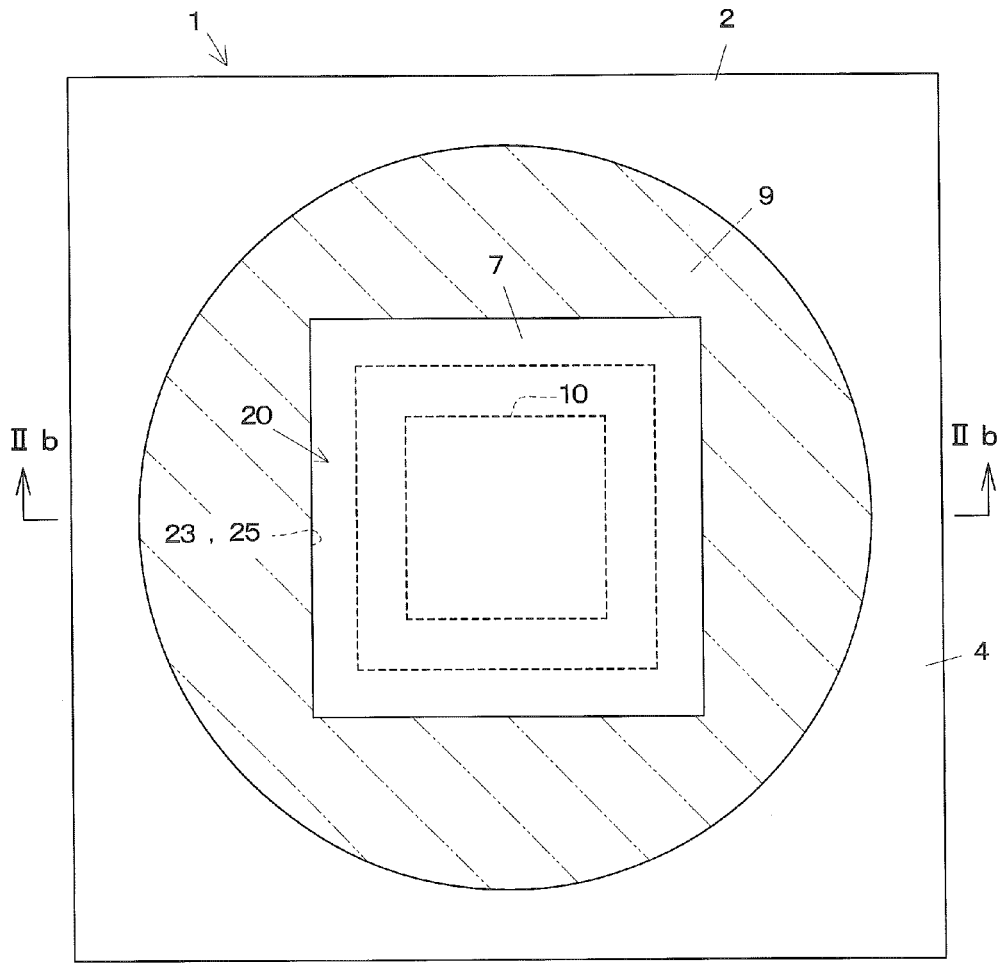
Figure 2B:
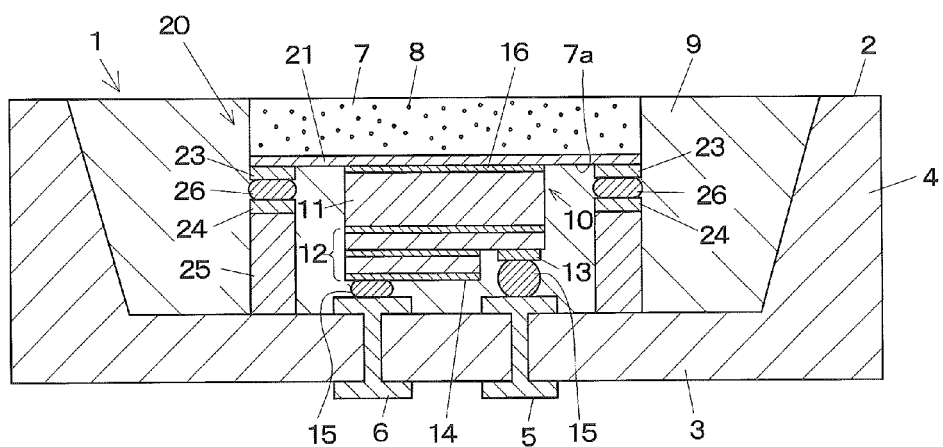

The light emitting device 1 according to a second embodiment illustrated in FIGS. 2A and 2B is different from the light emitting device 1 according to the first embodiment in the sub heat radiation path 20, and otherwise the same as the light emitting device 1 according to the first embodiment. Thus, only the sub heat radiation path 20 will be described, and the same portions are denoted in FIGS. 2A and 2B by the same reference numerals as those given in the first embodiment to omit description.

The sub heat radiation path 20 according to the second embodiment includes the transparent heat-conductive film 21 formed on the entire light input surface (the lower surface) of the wavelength conversion plate 7, the substrate portion 3 of the mount case 2 which serves as the heat radiator, and a heat-conductive block 25 (such as Cu or a stack of Cu and other metals) that serves as the thermal connection member and that thermally connects the transparent heat-conductive film 21 and the substrate portion 3 to each other. More particularly, a bonding pad 23 (for example, Au) in the shape of a rectangular frame as viewed in plan is provided in the vicinity of the peripheral edge of the lower surface of the transparent heat-conductive film 21 to be positioned below the extending portion 7a of the wavelength conversion plate 7 described above. The heat-conductive block 25 in the shape of a rectangular frame as viewed in plan is joined to the upper surface of the substrate portion 3, spaced from the LED chip 10. A bonding pad 24 (for example, Au) is provided on the upper surface of the heat-conductive block 25. The bonding pads 23 and 24 are joined to each other by solder 26 (for example, Au—Su solder). The heat-conductive block 25 may be Cu alone, or a stack of Cu and other metals (such as Ni), for example. The heat-conductive block 25 may be formed integrally with the substrate portion 3 from the same ceramic as the substrate portion 3.

With the light emitting device 1 according to the second embodiment, the following functions and effects can be obtained.

(1) The same as (1) of the first embodiment.

(2) Heat generated by an energy loss caused when the fluorescent substance 8 of the wavelength conversion plate 7 is converted in terms of the wavelength is transmitted to the lower surface of the wavelength conversion plate 7 to be radiated firstly through a main heat radiation path including the inorganic adhesive 16, the LED chip 10, the bumps 15, the patterns 5 and 6, and the substrate portion 3 arranged in this order. Secondly, the heat is radiated through the sub heat radiation path 20 including the transparent heat-conductive film 21, the bonding pads 23, the solder 26, the bonding pads 24, the heat-conductive block 25, and the substrate portion 3 arranged in this order. The heat radiation function provides the same effect as (2) of the first embodiment.

(3) The heat-conductive block 25 is embedded in the light-reflective covering material 9. Therefore, the heat-conductive block 25 functions as an internal structure (reinforcement) for the light-reflective covering material 9 to improve the stability of the light-reflective covering material 9.

(4) The heat-conductive block 25 functions to block light emitted from the LED chip 10 and radiated laterally to partially penetrate the light-reflective covering material 9.

(5) The same as (5) of the first embodiment.

(6) The heat-conductive block 25 functions as a block that mechanically supports the wavelength conversion plate 7 to improve the stability of the wavelength conversion plate 7.

Third Embodiment

Figure 3A:
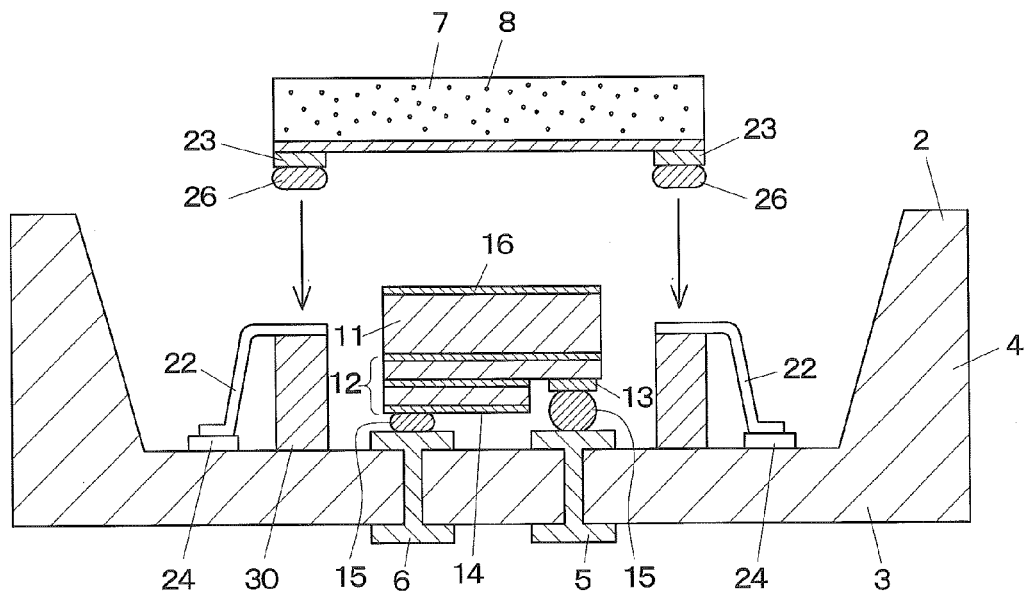
Figure 3B:
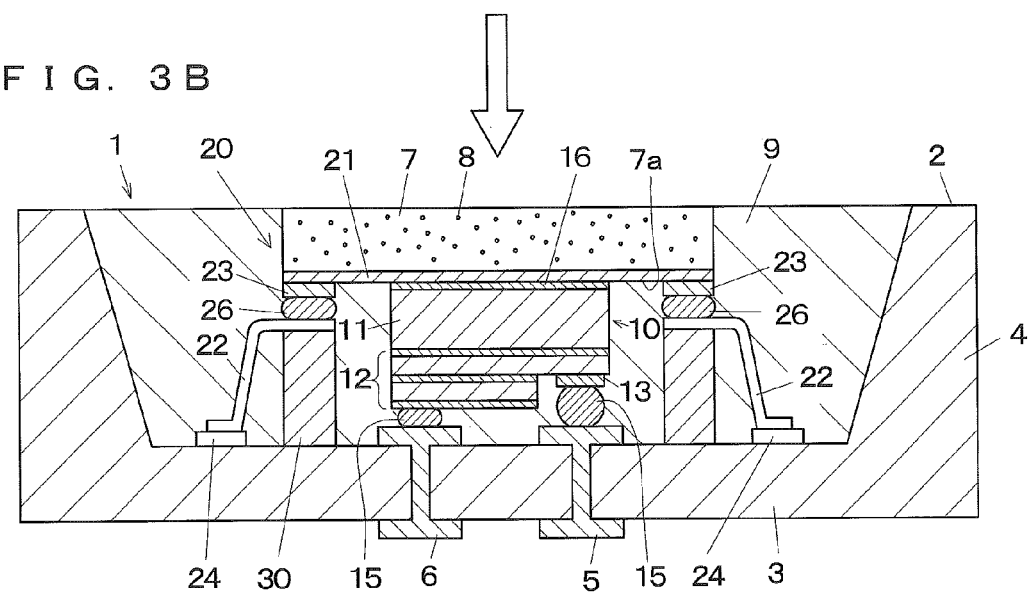

The light emitting device 1 according to a third embodiment illustrated in FIGS. 3A and 3B is different from the light emitting device 1 according to the first embodiment in the sub heat radiation path 20, and otherwise the same as the light emitting device 1 according to the first embodiment. Thus, only the sub heat radiation path 20 will be described, and the same portions are denoted in FIGS. 3A and 3B by the same reference numerals as those given in the first embodiment to omit description.

The sub heat radiation path 20 according to the third embodiment includes the transparent heat-conductive film 21 formed on the entire light input surface (the lower surface) of the wavelength conversion plate 7, the substrate portion 3 of the mount case 2 which serves as the heat radiator, and ribbon wires 22 (for example, Al) that serve as the thermal connection member and that thermally connect the transparent heat-conductive film 21 and the substrate portion 3 to each other. More particularly, a bonding pad 23 (for example, Au) in the shape of a rectangular frame as viewed in plan is provided in the vicinity of the peripheral edge of the lower surface of the transparent heat-conductive film 21 to be positioned below the extending portion 7a of the wavelength conversion plate 7 described above. A support block 30 in the shape of a rectangular frame as viewed in plan is joined to the upper surface of the substrate portion 3, spaced from the LED chip 10. Bonding pads 24 (for example, Au) are provided at four locations on the upper, surface of the substrate portion 3, spaced from the support block 30. The lower end portions of the ribbon wires 22 are bonded to the respective bonding pads 24. The upper end portions of the ribbon wires 22 are placed on the support block 30. The bonding pads 23 and the upper end portions of the ribbon wires 22 are joined to each other by the solder 26 (for example, Au—Su solder). The support block 30 is not necessarily required to be thermally conductive. Thus, the support block 30 is formed from a resin, for example (and hence more inexpensive than that formed from a metal or a ceramic).

With the light emitting device 1 according to the third embodiment, the following functions and effects can be obtained.

(1) The same as (1) of the first embodiment.

(2) Heat generated by an energy loss caused when the fluorescent substance 8 of the wavelength conversion plate 7 is converted in terms of the wavelength is transmitted to the lower surface of the wavelength conversion plate 7 to be radiated firstly through a main heat radiation path including the inorganic adhesive 16, the LED chip 10, the bumps 15, the patterns 5 and 6, and the substrate portion 3 arranged in this order. Secondly, the heat is radiated through the sub heat radiation path 20 including the transparent heat-conductive film 21, the bonding pads 23, the solder 26, the ribbon wires 22, and the substrate portion 3 arranged in this order. The heat radiation function provides the same effect as (2) of the first embodiment.

(3) The support block 30 is embedded in the light-reflective covering material 9. Therefore, the support block 30 functions as an internal structure (reinforcement) for the light-reflective covering material 9 to improve the stability of the light-reflective covering material 9.

(4) The support block 30 functions to block light emitted from the LED chip 10 and radiated laterally to partially penetrate the light-reflective covering material 9.

(5) The same as (5) of the first embodiment.

(6) The support block 30 functions as a block that mechanically supports the wavelength conversion plate 7 to improve the stability of the wavelength conversion plate 7.

Fourth Embodiment

Figure 4:
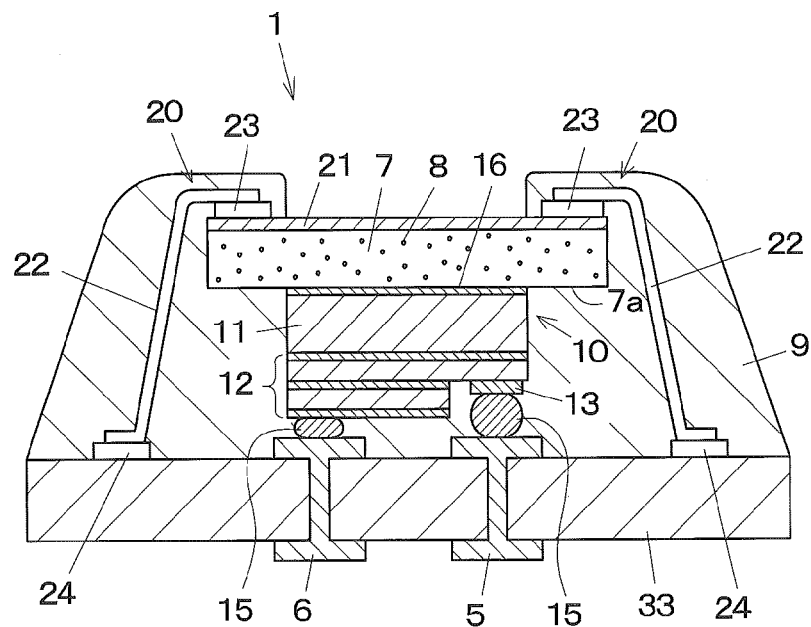
FIG. 4 is a sectional view of a light emitting device according to a fourth embodiment.

The light emitting device 1 according to a fourth embodiment illustrated in FIG. 4 is different from the light emitting device 1 according to the first embodiment in that a sub mount 33 is used in place of a case mount, and otherwise the same as the light emitting device 1 according to the first embodiment. Thus, only the difference will be described, and the same portions are denoted in FIG. 4 by the same reference numerals as those given in the first embodiment to omit description.

The sub mount 33 has a simple plate shape, and does not have a frame portion such as that in the first embodiment. Therefore, the light-reflective covering material 9 is formed in a mound shape. With the light emitting device 1 according to the fourth embodiment, the same functions and effects as those of the first embodiment can be obtained.

Modifications

FIGS. 5A to 5E illustrate first to fifth modifications in which the wavelength conversion plate 7 or the transparent heat-conductive film 21 according to the embodiments described above is changed.

Figure 5A:
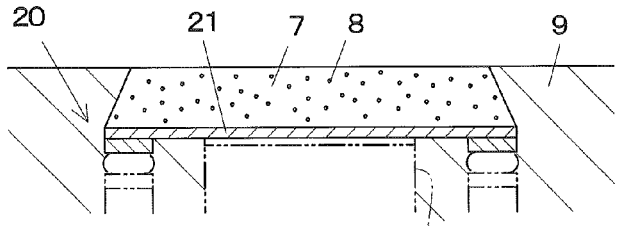

In the first modification illustrated in FIG. 5A, the wavelength conversion plate 7 has tapered side end surfaces that become narrower as they extend upward so that the wavelength conversion plate 7 does not slip upward out of the light-reflective covering material 9.

Figure 5B:
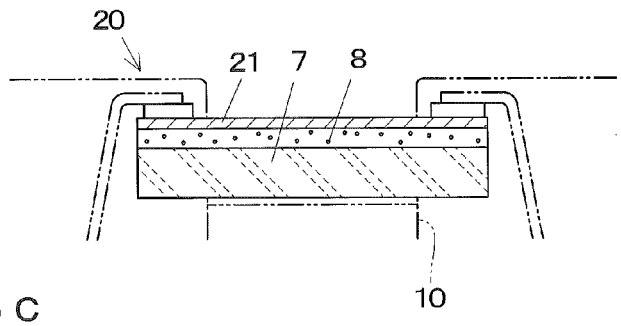

In the second modification illustrated in FIG. 5B, a plate made of a transparent inorganic material (for example, glass) in which the fluorescent substance 8 is provided as a layer on the light output surface is used as the wavelength conversion plate 7 according to the first embodiment.

Figure 5C:
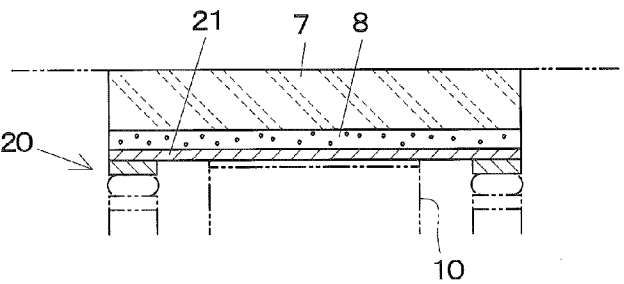

In the third modification illustrated in FIG. 5C, a plate made of a transparent inorganic material (for example, glass) in which the fluorescent substance 8 is provided as a layer on the light input surface is used as the wavelength conversion plate 7 according to the second or third embodiment.

Figure 5D:
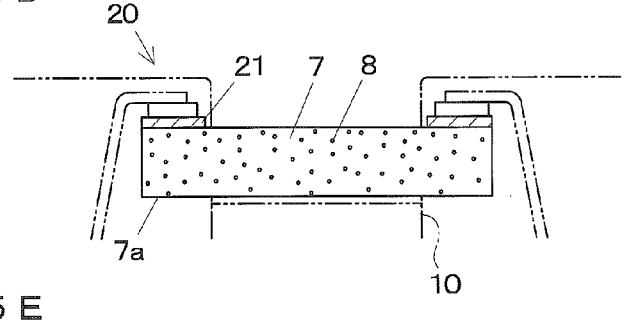

In the fourth modification illustrated in FIG. 5D, the transparent heat-conductive film 21 according to the first embodiment is provided on the extending portion 7a of the wavelength conversion plate 7, of the light output surface, so as not to be present above the LED chip 10. The configuration has the effect of reducing the amount of light to be absorbed by the transparent heat-conductive film 21.

Figure 5E:
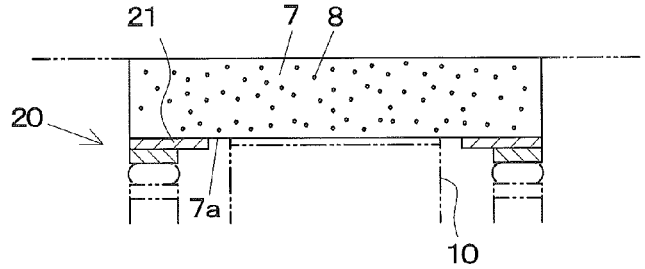

In the fifth modification illustrated in FIG. 5E, the transparent heat-conductive film 21 according to the second or third embodiment is provided on the extending portion 7a of the wavelength conversion plate 7, of the light input surface, so as not to be present above the LED chip 10. The configuration has the effect of reducing the amount of light to be absorbed by the transparent heat-conductive film 21.

Example 5

Figure 6A:
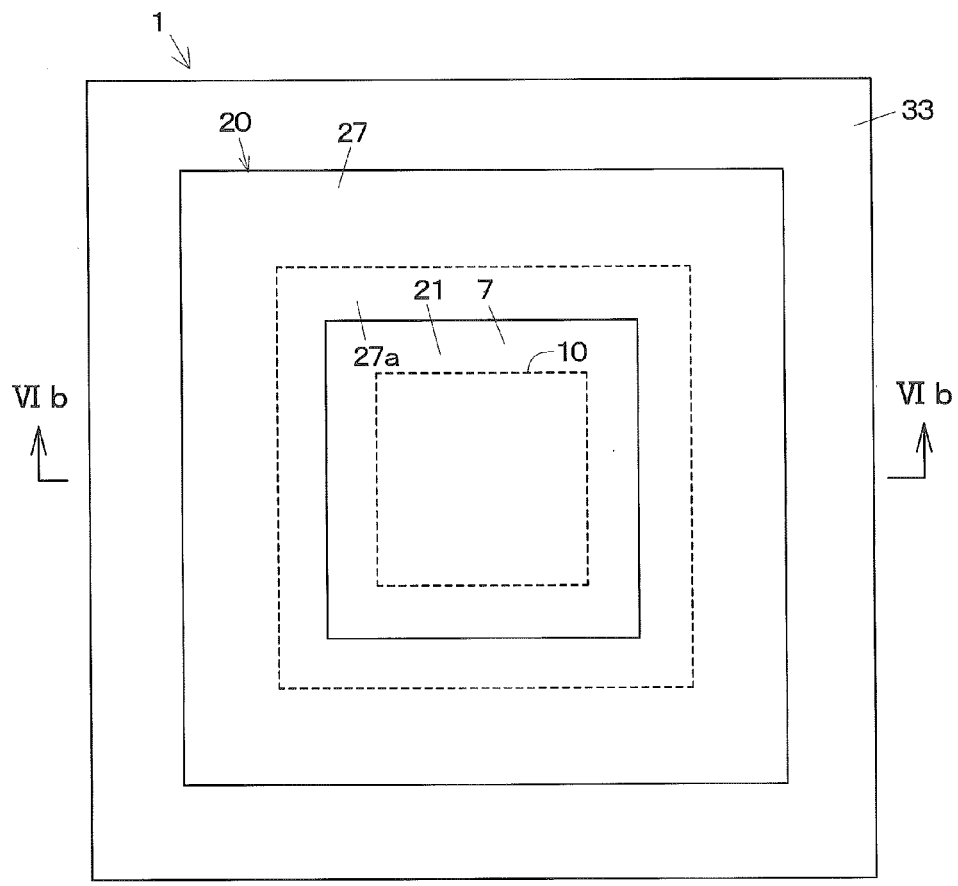
Figure 6B:
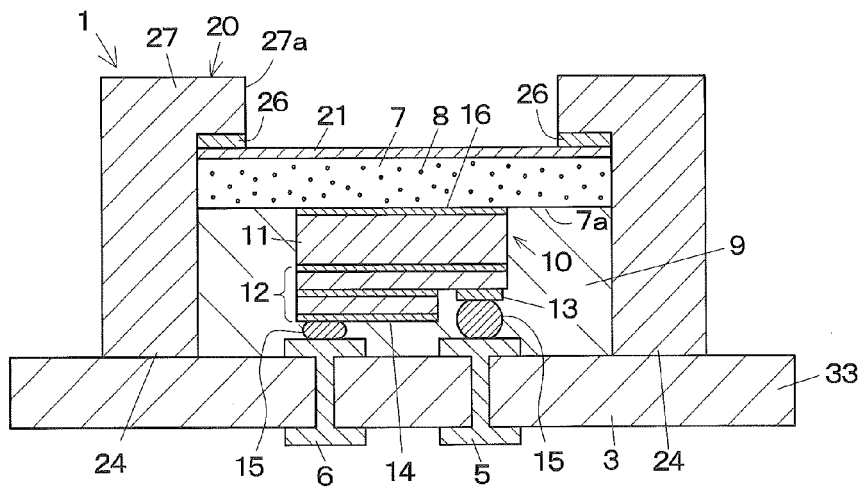
Figure 7:
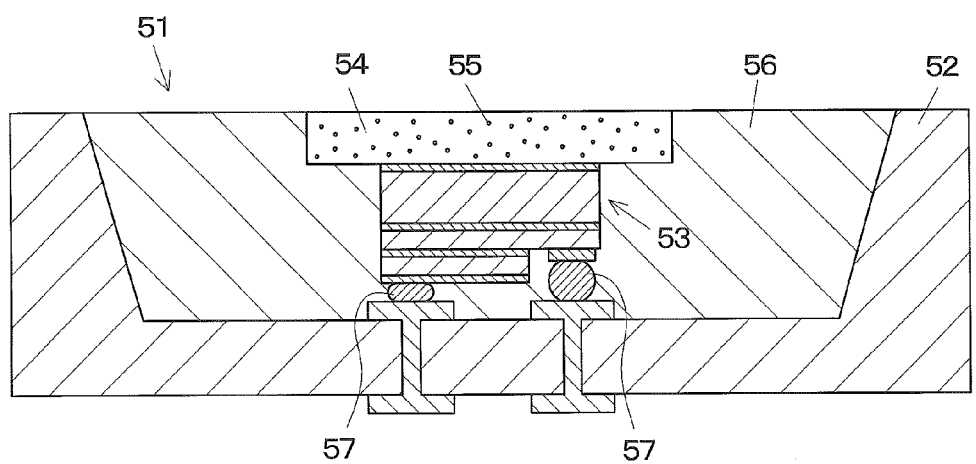
FIG. 7 is a sectional view of a light emitting device according to the related art.

The light emitting device 1 according to a fifth embodiment illustrated in FIGS. 6A and 6B is different from the light emitting device 1 according to the first embodiment in that a sub mount 33 is used in place of a case mount, and in the sub heat radiation path 20, and otherwise the same as the light emitting device 1 according to the first embodiment. Thus, only the sub mount 33 and the sub heat radiation path 20 will be described, and the same portions are denoted in FIGS. 6A and 6B by the same reference numerals as those given in the first embodiment to omit description.

The sub mount 33 (for example, AlN) has a simple plate shape, and does not have a frame portion such as that in the first embodiment. The sub heat radiation path 20 according to the fifth embodiment includes the transparent heat-conductive film 21 formed on the entire light output surface (the upper surface) of the wavelength conversion plate 7, the sub mount 33 which serves as the heat radiator, and a heat-conductive frame 27 that serve as the thermal connection member and that thermally connect the transparent heat-conductive film 21 and the sub mount 33 to each other. The heat-conductive frame 27 is formed in a frame block shape from a ceramic (for example, AlN) and surrounds the LED chip 10 and a side perimeter of the wavelength conversion plate 7. An inwardly projecting portion 27a is formed on an upper part of the heat-conductive frame 27. The heat-conductive frame 27 is joined to the upper surface of the sub mount 33. The projecting portion 27a is positioned above the extending portion 7a of the wavelength conversion plate 7, and the projecting portion 27a and the vicinity of the peripheral edge of the upper surface of the transparent heat-conductive film 21 are joined to each other by the solder 26. The heat-conductive frame 27 may be made of metals (for example, Cu, Al) as long as it ensures insulation from the other members. The transparent heat-conductive film 21 may be provided on the extending portion 7a of the wavelength conversion plate 7, of the light output surface, so as not to be present above the LED chip 10, as illustrated in FIG. 5D.

With the light emitting device 1 according to the fifth embodiment, the following functions and effects can be obtained.

(1) The same as (1) of the first embodiment.

(2) Heat generated by an energy loss caused when the fluorescent substance 8 of the wavelength conversion plate 7 is converted in terms of the wavelength is transmitted to the lower surface of the wavelength conversion plate 7 to be radiated firstly through a main heat radiation path including the inorganic adhesive 16, the LED chip 10, the bumps 15, the patterns 5 and 6, and the substrate portion 3 arranged in this order. Secondly, the heat is radiated through the sub heat radiation path 20 including the transparent heat-conductive film 21, the solder 26, the heat-conductive frame 27, and the sub mount 33 arranged in this order. The heat radiation function provides the same effect as (2) of the first embodiment.

(3) The heat-conductive frame 27 surrounds the light-reflective covering material 9. Therefore, the heat-conductive frame 27 protects the light-reflective covering material 9.

(4) The heat-conductive frame 27 functions to block light emitted from the LED chip 10 and radiated laterally to partially penetrate the light-reflective covering material 9.

(5) The same as (5) of the first embodiment.

(6) The heat-conductive frame 27 functions as a block that mechanically supports the wavelength conversion plate 7 to improve the stability of the wavelength conversion plate 7.

The present invention is not limited to the above embodiments and can be embodied with modifications as needed without departing from the spirit of the present invention.

REFERENCE SIGNS LIST

1 light emitting device
2 mount case
3 substrate portion
4 frame portion
5 negative pattern
6 positive pattern
7 wavelength conversion plate
7a extending portion
8 fluorescent substance
9 light-reflective covering material
10 LED chip
11 transparent substrate
20 sub heat radiation path
21 transparent heat-conductive film
22 ribbon wire
23 bonding pad
24 bonding pad
25 heat-conductive block
26 solder
27 heat-conductive frame
30 support block
33 sub mount

The invention claimed is:

1. A light emitting device comprising:
a light emitting diode (LED) chip;
a wavelength conversion plate including a fluorescent substance and disposed on a light output surface side of the LED chip; and
a sub heat radiation path formed to radiate heat of the wavelength conversion plate, the sub heat radiation path comprising:
a transparent heat-conductive film provided on a surface of the wavelength conversion plate;
a heat radiator provided in the vicinity of the LED chip; and
a thermal connection member that thermally connects the transparent heat-conductive film to the heat radiator.

2. The light emitting device according to claim 1, wherein the heat radiator is a mount, and the LED chip is mounted on the mount through flip-chip mounting.

3. The light emitting device according to claim 1, wherein the transparent heat-conductive film is provided on a light output surface of the wavelength conversion plate, and a wire is used as the thermal connection member.

4. The light emitting device according to claim 1, wherein the wavelength conversion plate is formed to be large enough to extend off a peripheral edge of the LED chip, the transparent heat-conductive film is provided on at least an extending portion of a light input surface of the wavelength conversion plate that extends off the peripheral edge of the LED chip, and a heat-conductive block that mechanically supports the extending portion of the wavelength conversion plate is used as the thermal connection member.

5. The light emitting device according to claim 1, wherein the wavelength conversion plate is formed to be large enough to extend off a peripheral edge of the LED chip, the transparent heat-conductive film is provided on at least an extending portion of a light input surface of the wavelength conversion plate that extends off the peripheral edge of the LED chip, and a support block that mechanically supports the extending portion of the wavelength conversion plate is provided, and a wire that is connected to the transparent heat-conductive film for the extending portion of the wavelength conversion plate is used as the thermal connection member.

6. The light emitting device according to claim 1, wherein the wavelength conversion plate is formed to be large enough to extend off a peripheral edge of the LED chip, the transparent heat-conductive film is provided on at least an extending portion of a light output surface of the wavelength conversion plate that extends off the peripheral edge of the LED chip, and a heat-conductive frame that surrounds a side perimeter of the wavelength conversion plate is used as the thermal connection member.

7. The light emitting device according to claim 1, further comprising:
   a light-reflective covering material that covers a perimeter of the LED chip wherein,
   the thermal connection member is embedded in the light-reflective covering material.

8. The light emitting device according to claim 7, wherein the wavelength conversion plate has tapered side end surfaces that become narrower as the side end surfaces extend upward, and the light-reflective covering material also covers the side end surfaces of the wavelength conversion plate.

9. A manufacturing method for a light emitting device, comprising:
   mounting a light emitting diode (LED) chip on a mount through flip-chip mounting;
   disposing a wavelength conversion plate on a light output surface side of the LED chip, the wavelength conversion plate including a fluorescent substance, a transparent heat-conductive film being provided on a surface of the wavelength conversion plate; and
   thermally connecting the transparent heat-conductive film to the mount by a thermal connection member.

* * * * *